(12) United States Patent
Chen et al.

(10) Patent No.: US 7,556,525 B2
(45) Date of Patent: Jul. 7, 2009

(54) FLEXIBLE PRINTED CIRCUIT

(75) Inventors: Shih-Hsien Chen, Hsinchu (TW); Kuang-Tao Sung, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/758,257

(22) Filed: Jun. 5, 2007

(65) Prior Publication Data

US 2008/0139015 A1    Jun. 12, 2008

(30) Foreign Application Priority Data

Dec. 7, 2006    (TW) .............................. 95145682 A

(51) Int. Cl.
*H01R 12/24*    (2006.01)
(52) U.S. Cl. ...................................... 439/498
(58) Field of Classification Search ................ 361/749; 174/254; 439/67, 498
See application file for complete search history.

(56) References Cited

U.S. PATENT DOCUMENTS

| | | | | |
|---|---|---|---|---|
| 4,065,199 | A | * | 12/1977 | Andre et al. ................. 439/498 |
| 6,702,607 | B2 | * | 3/2004 | Kondo ........................ 439/498 |
| 6,723,925 | B2 | * | 4/2004 | Ohara et al. ............ 174/113 R |
| 6,969,806 | B2 | * | 11/2005 | Dupriest .................. 174/117 F |
| 2006/0225914 | A1 | | 10/2006 | Tan |

OTHER PUBLICATIONS

English language translation of abstract of JP 2006-165079.

* cited by examiner

*Primary Examiner*—Jean F Duverne
(74) *Attorney, Agent, or Firm*—Thomas, Kayden, Horstemeyer & Risley

(57) ABSTRACT

A flexible printed circuit comprises a first region, a second region, and a connection region. The connection region connects the first region and the second region, and has a surface. When the flexible printed circuit is used, the connection region can be bent so that part of the surface overlaps in order to present a particular angle between the first region and the second region.

11 Claims, 6 Drawing Sheets

FLEXIBLE PRINTED CIRCUIT

This application claims the benefit of priority based on Taiwan Patent Application No. 095145682 filed on Dec. 7, 2006, the disclosures of which are incorporated herein by reference in their entirety.

CROSS-REFERENCES TO RELATED APPLICATIONS

Not applicable.

BACKGROUND OF THE INVENTION

1. Field of the Invention

The present invention relates to a flexible printed circuit (FPC); more specifically, the present invention relates to a flexible printed circuit capable of being bent to present a particular angle.

2. Descriptions of the Related Art

With the ever increasing use of consumer electronic products, high performance and light weight are a requirement of modern electronic products. In corresponding to this trend, FPC boards with flexible characteristics have been widely used in various electronic equipment, such as displays, laptops, mobile phones, digital cameras, personal digital assistants (PDAs), printers and optical disc drives.

Using a display module and a back light unit (BLU) of the display shown in FIG. 1 as an example, a flexible printed circuit 1 of the prior art needs to be bent to an angle during manufacturing. As shown further in FIG. 2, during manufacturing, many of the flexible printed circuits 1 are arranged on a substrate 2 so that they can be mass produced to reduce cost on the single substrate 2. However, the angle of the flexible printed circuit 1 is fixed so the space utilization ratio for the substrate 2 is extremely low. Generally speaking, the operative space utility rate of the substrate 2 for manufacturing the flexible circuits 1 is only 21.66%, while the remaining space on the substrate 2 is unused. Accordingly, this manufacturing method causes material waste and increases the cost.

Consequently, increasing the space utilization ratio of the substrate for manufacturing flexible printed circuits on a substrate without affecting manufacturing difficulties and performance of the flexible printed circuits is still an objective for the industry to endeavor.

SUMMARY OF THE INVENTION

One objective of this invention is to provide a flexible printed circuit, which comprises a first region, a second region, and a connection region. The connection region, having a surface, connects the first region and the second region. When the flexible printed circuit is used, the connection region is bent so that part of the surface overlaps in order to present a particular angle between the first region and the second region.

Another objective of this invention is to provide a flexible printed circuit, which comprises a bent region with a surface. When the flexible printed circuit is used, the bent region is bent so that part of this surface overlaps.

The present invention eliminates the need for a flexible printed circuit to be bent during manufacturing. When the flexible printed circuit is used, the region which can be bent is bent to form a required angle or shape to increase the space utilization ratio of the substrate, and thus the flexible printed circuit can be manufactured without affecting performance.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
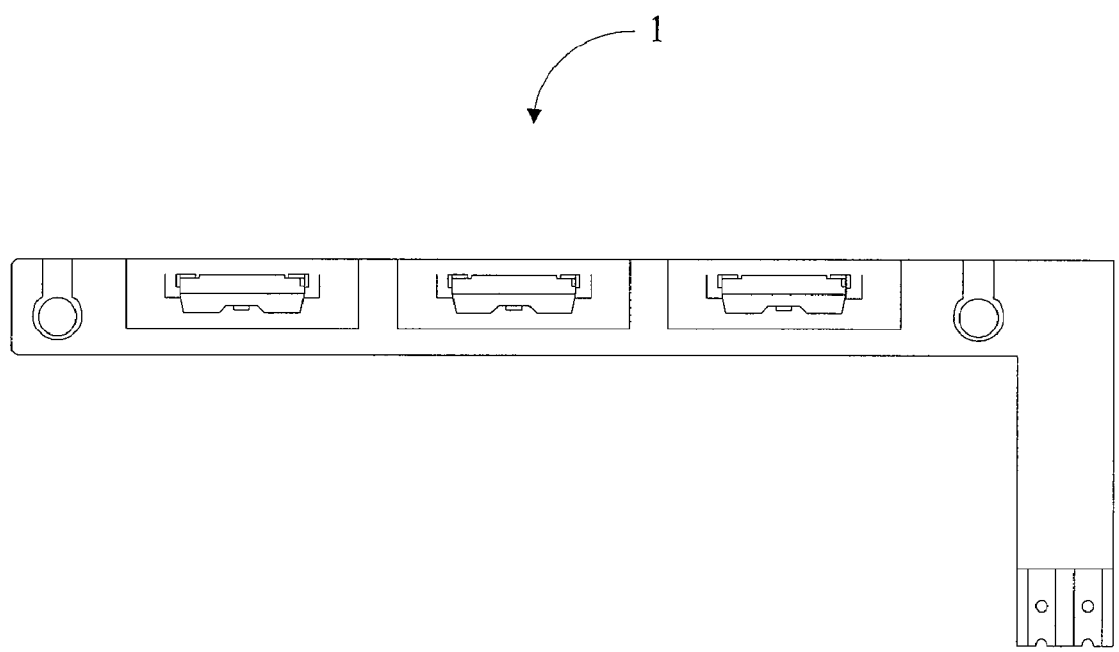
FIG. 1 is a schematic diagram illustrating a flexible printed circuit of the prior art.
Figure 2:
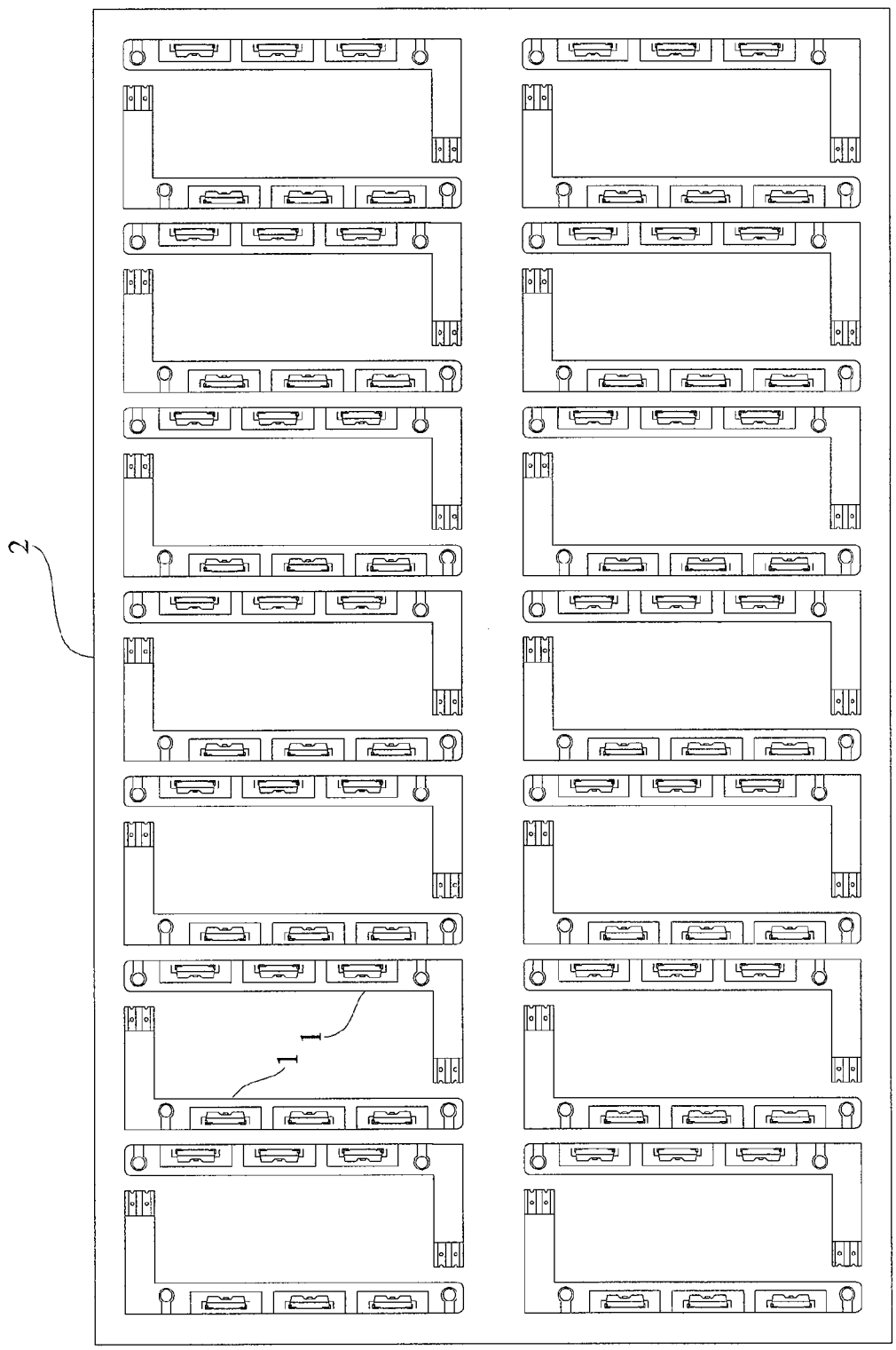
FIG. 2 is a schematic diagram illustrating the flexible printed circuit arranged on a substrate of the prior art.
Figure 3:
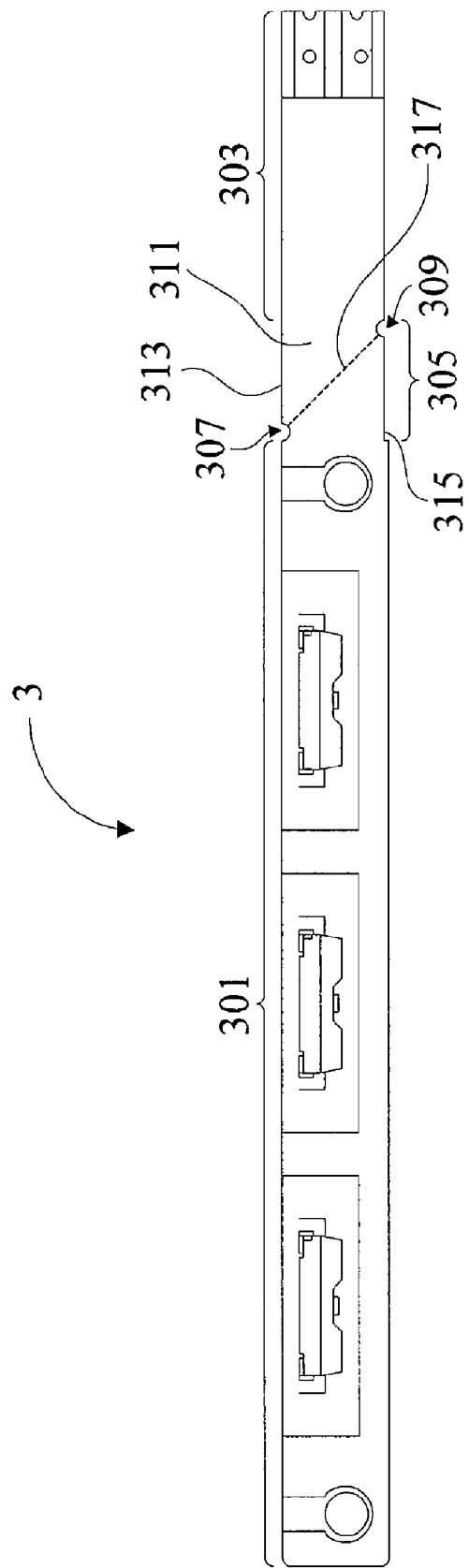
FIG. 3 is a schematic diagram illustrating a first embodiment of the present invention.
Figure 4:
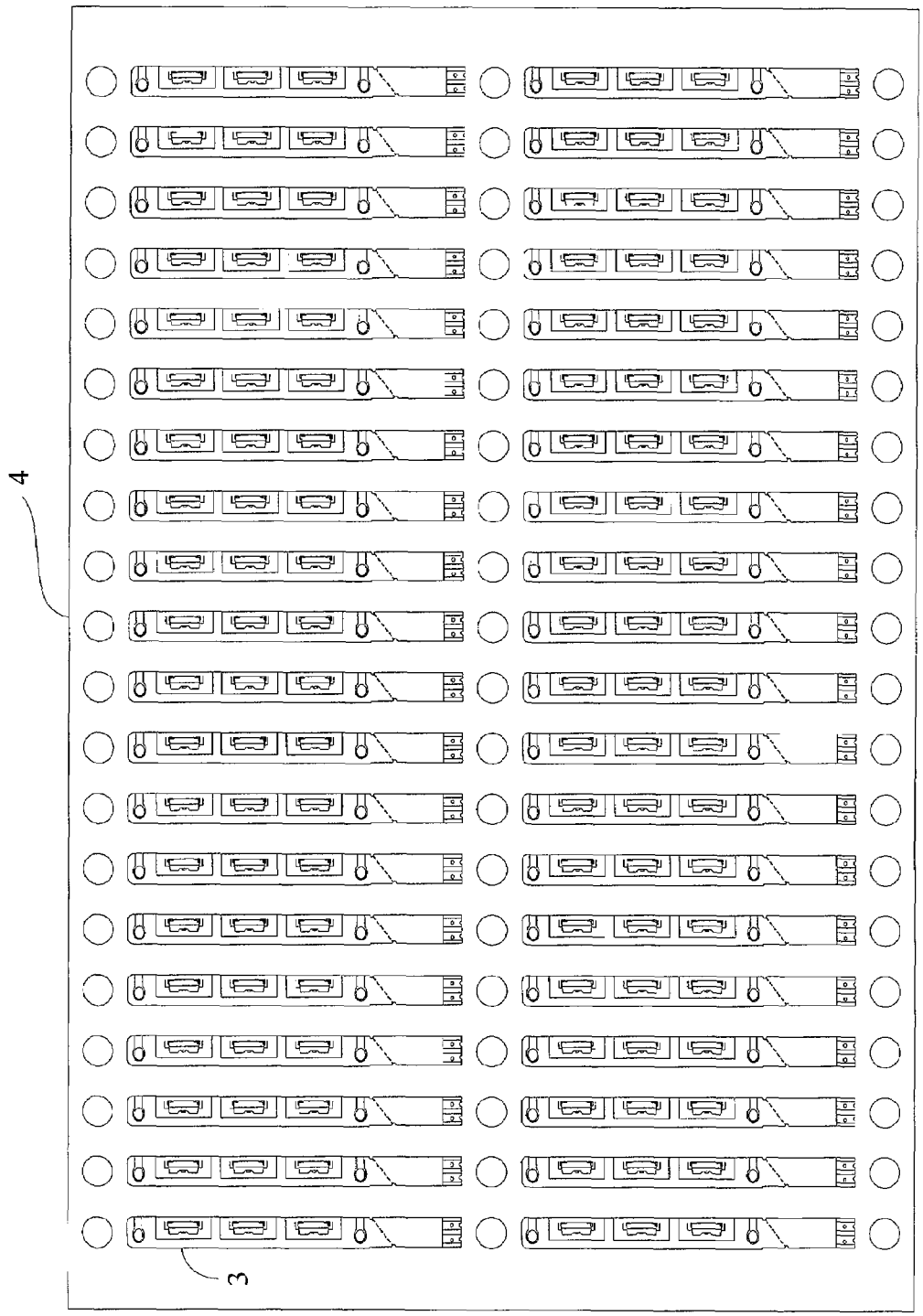
FIG. 4 is a schematic diagram illustrating a flexible printed circuit of the first embodiment arranged on a substrate.

As shown in FIG. 3, a first embodiment of the present invention is a flexible printed circuit 3. The flexible printed circuit 3 comprises a first region 301, a second region 303, and a connection region 305. The first region 301 is rectangular and has two short sides and two long sides. The second region 303 is the same as the first region 301 and also has two short sides and two long sides as well. The connection region 305 connects one short side of the first region 301 and one short side of the second region 303 so that the flexible printed circuit 3 forms into a rectangular shape. The connection region 305 comprises a first concave contour 307, a second concave contour 309, a surface 311, a first side 313, and a second side 315. During manufacturing, since the flexible printed circuit 3 is rectangular, the flexible printed circuits 3 can be densely arranged on a substrate to increase the utilization ratio of the substrate. As shown in FIG. 4, the operative space utility rate of a substrate 4 for manufacturing the flexible circuits 3 is 38.1%, while the remaining space is unused substrate material.

When the flexible printed circuit 3 is used, the first concave contour 307 and the second concave contour 309 outline a bending angle for the connection 305. More specifically, the connection region 305 is a bent region. The first concave contour 307 is located at a connection between the connection region 305 and the first region 301, and is also located at the first side 313. The second concave contour 309 is located at a connection between the connection region 305 and the second region 303, and is also located at the second side 315 which is opposite to the first side 313. Consequently, the first concave contour 307 and the second concave contour 309 are arranged in a diagonal line 317. The connection region 305 is bent along this diagonal line 317.

Figure 5:
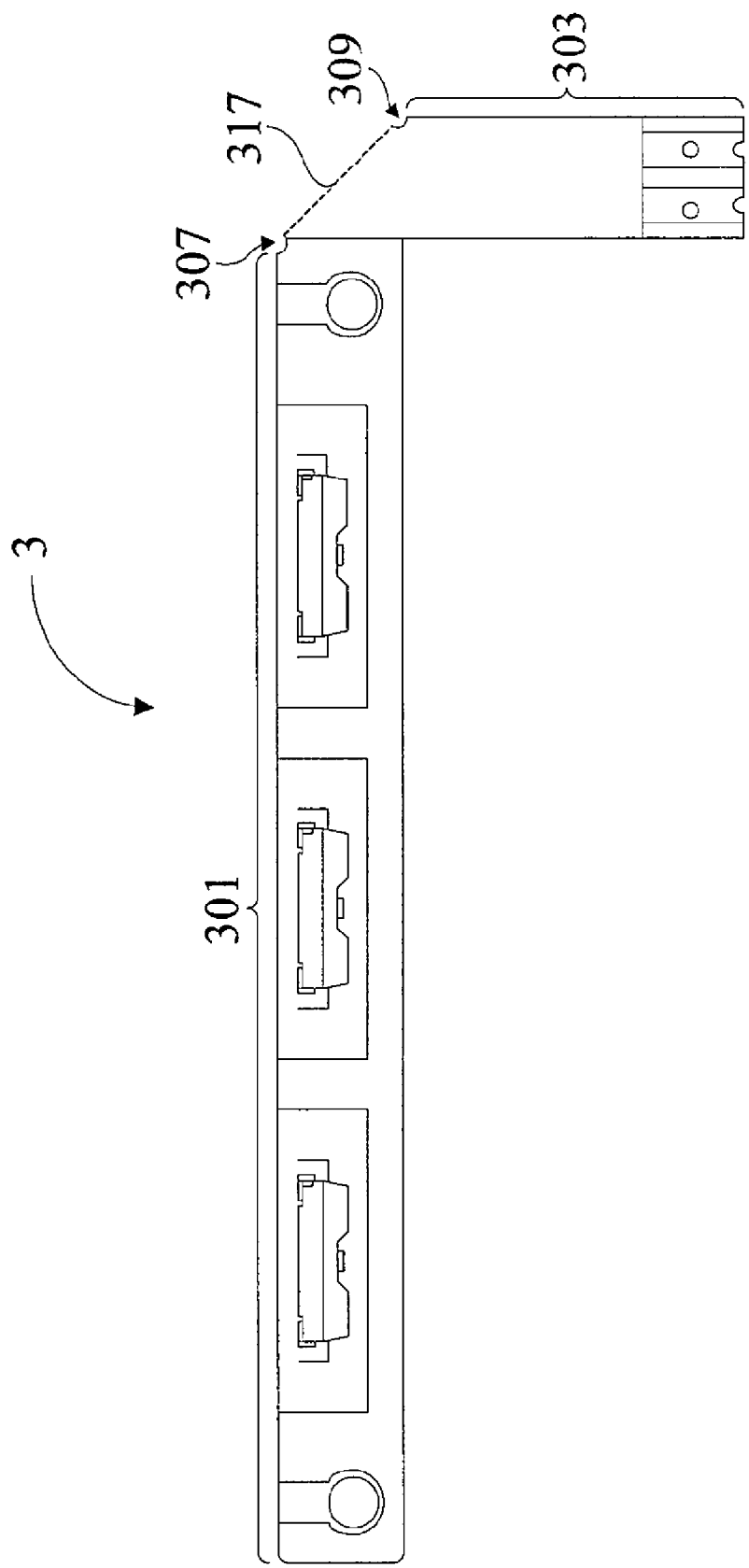
FIG. 5 is another schematic diagram illustrating the first embodiment of the present invention.

As shown in FIG. 5, part of the surface 311 overlaps in order to present a particular angle between the first region 301 and the second region 303 after the flexible printed circuit 3 is bent. For example, the first region 301 and the second region 303 of the embodiment present a 90° angle. There should be noted that the required angle for bending depends on physical applications. That is, the corresponding position of the first concave contour 307 and the second concave contour 309 depends on physical applications. The present invention is not limited to the angle between the first region 301 and the second region 303.

The connection region 305 of the flexible printed circuit 3 in the first embodiment can be manufactured from a polyimide (PI) composite material, printing, or other materials which can be easily bent and fixed without fragmenting.

Figure 6:
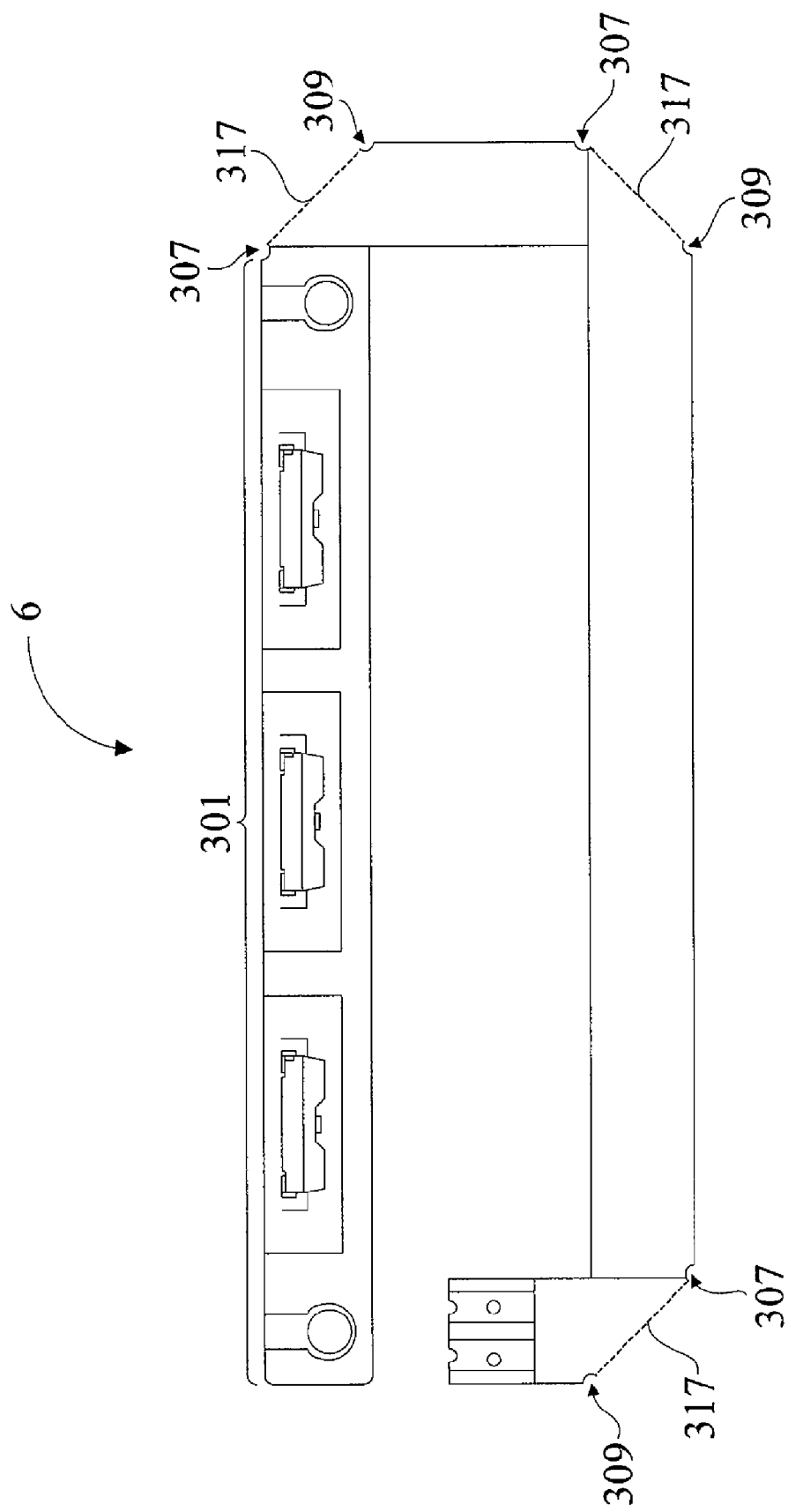
FIG. 6 is a schematic diagram illustrating a second embodiment of the present invention.

As shown in FIG. 6, a second embodiment of the present invention is also a flexible printed circuit 6 with a similar structure of the flexible printed circuit 3. The difference between the first embodiment and the second embodiment is that the flexible printed circuit 6 comprises a plurality of connection regions so that the flexible printed circuit 6 can be bent along the diagonal lines 317 of the connection regions to make the geometry contour of the flexible printed circuit 6 present a specific geometric figure. An example is shown in FIG. 6. Since the flexible printed circuit 6 comprises three connection regions, the connection regions can make the geometry contour of the flexible printed circuit 6 present a rectangle.

Besides the rectangle, the number of connection regions and the bent angle of the connection regions of the flexible printed circuit of the present invention will affect the shape of the geometry contour of the flexible printed circuit. For example, the geometry contour of the flexible printed circuit of the present invention can also present a geometry contour of a triangle, a pentagon, a hexagon, or other shapes.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A flexible printed circuit, comprising:
   a first region;
   a second region; and
   a connection region for connecting the first region and the second region, the connection region having a surface, wherein the connection region has a first concave contour and a second concave contour for positioning the bend of the connection region, the first concave contour is located between the connection region and the first region, and the second concave contour is located between the connection region and the second region;
   wherein when the flexible printed circuit is used, the connection region is bent so that part of the surface overlaps in order to present a particular angle between the first region and the second region.

2. The flexible printed circuit as claimed in claim 1, wherein the connection region comprises:
   a first side; and
   a second side opposite to the first side;
   wherein the first concave contour is located at the first side, and the second concave contour is located at the second side.

3. The flexible printed circuit as claimed in claim 2, wherein the first concave contour and the second concave contour are arranged in a diagonal line, and the connection region is bent along the diagonal line.

4. The flexible printed circuit as claimed in claim 1, wherein the first region and the second region are rectangles and have a relatively short side respectively, and the connection region connects the relatively short sides of the first region and the second region.

5. The flexible printed circuit as claimed in claim 1, wherein the connection region is made of polyimide composite material.

6. The flexible printed circuit as claimed in claim 1, wherein the connection region is manufactured by printing.

7. The flexible printed circuit as claimed in claim 1, wherein the particular angle makes a geometry contour of the flexible printed circuit present a geometry figure.

8. The flexible printed circuit as claimed in claim 1, wherein the particular angle makes a geometry contour of the flexible printed circuit present a triangle.

9. The flexible printed circuit as claimed in claim 1, wherein the particular angle makes a geometry contour of the flexible printed circuit present a rectangle.

10. The flexible printed circuit as claimed in claim 1, wherein the particular angle makes a geometry contour of the flexible printed circuit present a pentagon.

11. The flexible printed circuit as claimed in claim 1, wherein the particular angle makes a geometry contour of the flexible printed circuit present a hexagon.

* * * * *